(12) United States Patent
Jang et al.

(10) Patent No.: US 11,972,069 B2
(45) Date of Patent: Apr. 30, 2024

(54) LIGHT EMITTING DISPLAY DEVICE WITH INTEGRATED TOUCH SCREEN AND METHOD OF MANUFACTURING THE SAME

(71) Applicant: LG Display Co., Ltd., Seoul (KR)

(72) Inventors: Geon Jang, Seoul (KR); Jongmoo Ha, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/518,529

(22) Filed: Nov. 3, 2021

(65) Prior Publication Data

US 2022/0187937 A1 Jun. 16, 2022

(30) Foreign Application Priority Data

Dec. 10, 2020 (KR) .................. 10-2020-0172096

(51) Int. Cl.
| | |
|---|---|
| *G06F 3/041* | (2006.01) |
| *G06F 3/044* | (2006.01) |
| *H10K 50/844* | (2023.01) |
| *H10K 59/12* | (2023.01) |
| *H10K 59/40* | (2023.01) |
| *H10K 71/00* | (2023.01) |

(52) U.S. Cl.
CPC ........ *G06F 3/0412* (2013.01); *G06F 3/04164* (2019.05); *G06F 3/0446* (2019.05); *H10K 50/844* (2023.02); *H10K 59/12* (2023.02); *H10K 59/40* (2023.02); *H10K 71/00* (2023.02); *G06F 2203/04102* (2013.01); *G06F 2203/04103* (2013.01); *G06F 2203/04111* (2013.01); *H10K 59/1201* (2023.02)

(58) Field of Classification Search
None
See application file for complete search history.

(56) References Cited

U.S. PATENT DOCUMENTS

| | | | |
|---|---|---|---|
| 2015/0160754 A1* | 6/2015 | Wenzel | ............ G06F 3/041662 345/174 |
| 2017/0237025 A1* | 8/2017 | Choi | ...................... H10K 50/80 257/40 |

(Continued)

FOREIGN PATENT DOCUMENTS

| | | | | |
|---|---|---|---|---|
| CN | 108563373 A | * | 9/2018 | ............ G06F 3/044 |
| KR | 10-2019-0059079 A | | 5/2019 | |

*Primary Examiner* — Kirk W Hermann
(74) *Attorney, Agent, or Firm* — Seed IP Law Group LLP

(57) ABSTRACT

A light emitting display device includes: a substrate including a display area in which a plurality of display pixels are disposed and a non-display area surrounding the display area; an encapsulation film covering the display area and the non-display area and having a first inorganic encapsulation layer, an organic encapsulation layer, and a second inorganic encapsulation layer stacked in an order; a first touch electrode disposed on the encapsulation film and extending in a first direction and a second touch electrode extending in a second direction; at least one inorganic insulating layer disposed on the substrate; a first planarization layer disposed on the inorganic insulating layer; a second planarization layer disposed on the first planarization layer; and a hole pattern formed in the second planarization layer. The hole pattern has the organic encapsulation layer therein.

18 Claims, 5 Drawing Sheets

(56) References Cited

U.S. PATENT DOCUMENTS

| | | | | |
|---|---|---|---|---|
| 2018/0151838 | A1* | 5/2018 | Park | H01L 27/3258 |
| 2018/0275824 | A1* | 9/2018 | Li | G06F 3/0412 |
| 2018/0323240 | A1* | 11/2018 | Won | H01L 27/3276 |
| 2018/0366520 | A1* | 12/2018 | Gwon | H10K 50/8445 |
| 2019/0004654 | A1* | 1/2019 | Gwon | G06F 3/0443 |
| 2019/0036063 | A1* | 1/2019 | Lee | H10K 59/131 |
| 2019/0129548 | A1* | 5/2019 | Hwang | G06F 3/04164 |
| 2019/0129551 | A1* | 5/2019 | Lee | H01L 27/3276 |
| 2019/0131379 | A1* | 5/2019 | Won | H01L 27/3276 |
| 2019/0179449 | A1* | 6/2019 | Cho | G06F 3/0412 |
| 2019/0179466 | A1* | 6/2019 | Kim | G06F 3/044 |
| 2019/0334120 | A1* | 10/2019 | Seo | G06F 3/0444 |
| 2020/0026376 | A1* | 1/2020 | Lee | G06F 3/044 |
| 2020/0227682 | A1* | 7/2020 | Ohara | H10K 50/86 |
| 2020/0235338 | A1* | 7/2020 | Kim | H01L 51/5253 |
| 2020/0403050 | A1* | 12/2020 | Seon | H10K 71/00 |
| 2021/0028249 | A1* | 1/2021 | Ding | H01L 27/1288 |
| 2021/0313407 | A1* | 10/2021 | Li | H10K 59/124 |
| 2022/0077260 | A1* | 3/2022 | Choo | H10K 59/40 |

\* cited by examiner

LIGHT EMITTING DISPLAY DEVICE WITH INTEGRATED TOUCH SCREEN AND METHOD OF MANUFACTURING THE SAME

CROSS-REFERENCE TO RELATED APPLICATIONS

This application claims the benefit of and priority to Korean Patent Application No. 10-2020-0172096 filed on Dec. 10, 2020 in the Republic of Korea, the entire contents of which are hereby expressly incorporated by reference into the present application.

BACKGROUND

Technical Field

The present disclosure relates to a light emitting display device with an integrated touch screen and a method of manufacturing the same, and more particularly, to a light emitting display device with an integrated touch screen that has improved durability and a method of manufacturing the same.

Description of the Related Art

In accordance with development of information technology, markets for display devices, which are connection mediums between users and information, are growing. Accordingly, the use of display devices such as organic light emitting displays (OLEDs) and liquid crystal displays (LCDs) is increasing.

The display device includes a display panel including a plurality of sub-pixels and a driving unit for driving the display panel. The driving unit includes a scan driver that supplies a scan signal (or a gate signal) to the display panel, and a data driver that supplies a data signal to the display panel. In such display devices, when a scan signal and a data signal are supplied to sub-pixels disposed in a matrix form, the selected sub-pixels emit light to thereby display an image.

Meanwhile, in some of the display devices described above, a display panel is prepared based on a soft substrate instead of a hard substrate. Since the display device manufactured based on a soft substrate can impart flexibility, the display panel can be bent into a specific shape.

In addition, such a display device configures an interface with a user using various input devices. Demand for an input device that is convenient, simple, and capable of reducing malfunctions is ever-increasing. Accordingly, a touch device in which a user directly contacts a screen to input information has been proposed. In particular, when it is applied to an organic light emitting display device, elements constituting the touch device may be formed on an upper portion or a lower portion of an encapsulation film for protecting a light emitting part of an electroluminescent display device. That is, touch driving electrodes constituting a touch driving signal transmission channel and touch sensing electrodes constituting a touch recognition signal receiving channel are formed on an upper surface and/or a lower surface of the encapsulation film covering display elements of the electroluminescent display device.

BRIEF SUMMARY

A light emitting display device with an integrated touch screen, in which a touch device is integrally formed on an upper portion of an encapsulation film for protecting a light emitting part of the display device has a contact area for connecting signals of a touch driving element to a routing line of the touch screen. This contact area is located outside a dam formed in a non-display area of the display device, and there is a defect, in which an organic encapsulation layer included in the encapsulation film of the display device passes over the dam and is applied up to a contact area of a routing line and a link line of a touch pad, so that the signals of the touch driving element are not transmitted to the touch screen.

Accordingly, a technical feature of the present disclosure is to provide a light emitting display device with an integrated touch screen, in which an organic encapsulation layer is not applied to a link line-routing line connection unit in which the link line and the routing line are connected to each other.

Technical features and benefits of the present disclosure are not limited to the above-mentioned features and benefits, and other features and benefits, which are not mentioned above, can be clearly understood by those skilled in the art from the following descriptions.

In order to achieve the technical features described above, a light emitting display device with an integrated touch screen according to an embodiment of the present disclosure includes a substrate. The substrate includes a display area in which a plurality of display pixels are disposed and a non-display area surrounding the display area. An encapsulation film covers the display area and the non-display area, and has a first inorganic encapsulation layer, an organic encapsulation layer, and a second inorganic encapsulation layer stacked in an order. A first touch electrode is disposed on the encapsulation film and extends in a first direction, and a second touch electrode extends in a second direction. At least one inorganic insulating layer is disposed on the substrate. A first planarization layer is disposed on the inorganic insulating layer. A second planarization layer is disposed on the first planarization layer. A hole pattern is formed in the second planarization layer. The hole pattern has the organic encapsulation layer therein.

Other detailed matters of the embodiments are included in the detailed description and the drawings.

The light emitting display device with an integrated touch screen according to an embodiment of the present disclosure includes the hole pattern that penetrates the second planarization layer and that is formed concavely from an upper surface of the first planarization layer where the first and second planarization layers formed on the outside of the dam are sequentially stacked, so that the organic encapsulation layer of the encapsulation film overflowing to the outside of the dam fills the hole pattern. For this reason, the organic encapsulation layer is not applied to the link line-routing line connection unit where the routing line and the link line are connected. Therefore, it is possible to minimize or reduce a phenomenon in which a connection defect of the routing line formed on the encapsulation film and the link line connected to the touch pad occurs, so that a display device having high reliability can be provided.

In order to achieve the technical features and benefits described above, a method of manufacturing a light emitting display device with an integrated touch screen according to an embodiment of the present disclosure includes: forming a substrate including a display area in which a plurality of display pixels are disposed and a non-display area surrounding the display area; forming an encapsulation film covering the display area and the non-display area, the encapsulation film having a first inorganic encapsulation layer, an organic encapsulation layer, and a second inorganic encapsulation layer stacked in an order; disposing a first touch electrode extending in a first direction and a second touch electrode extending in a second direction, the first and second touch electrodes being formed on the encapsulation film; disposing at least one inorganic insulating layer on the substrate; disposing a first planarization layer on the inorganic insulating layer; disposing a second planarization layer on the first planarization layer; and forming a hole pattern in the second planarization layer, wherein the hole pattern has the organic encapsulation layer therein.

The effects according to the present disclosure are not limited to the contents exemplified above, and more various effects are included in the present specification.

DETAILED DESCRIPTION

Figure 1:
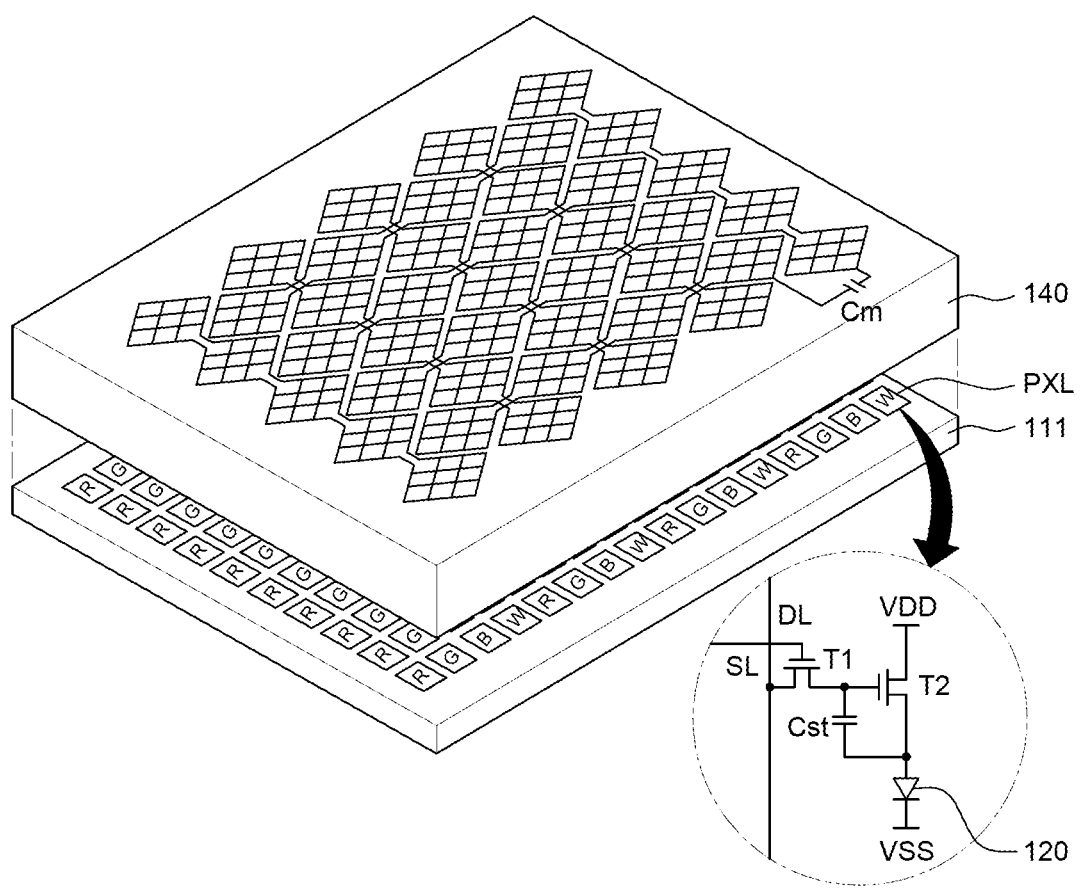
FIG. 1 is an exploded perspective view of an organic light emitting display device in which a touch sensor is integrated.
Figure 2:
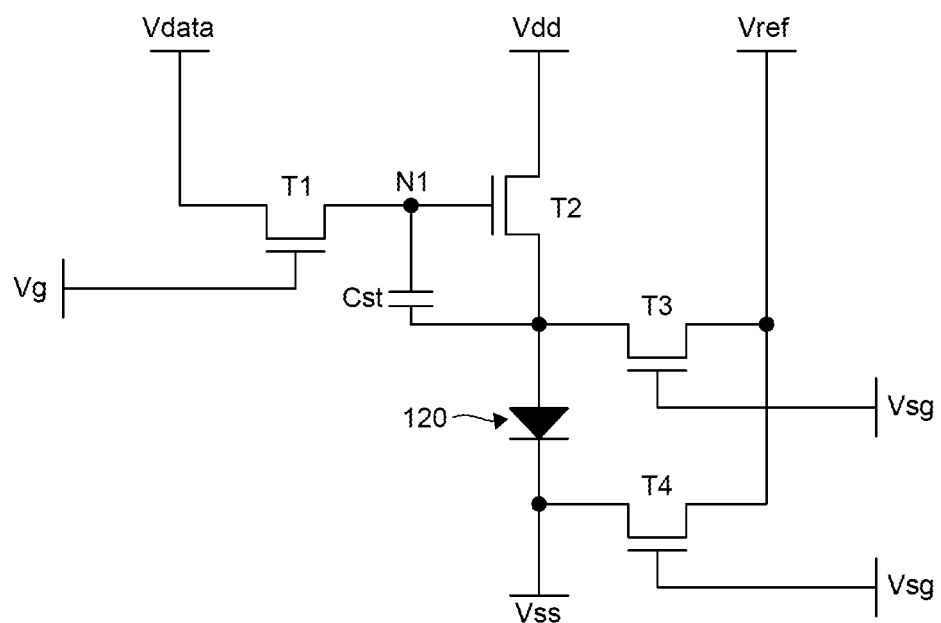
FIG. 2 is a circuit diagram of a sub-pixel illustrated in FIG. 1.
Figure 3:
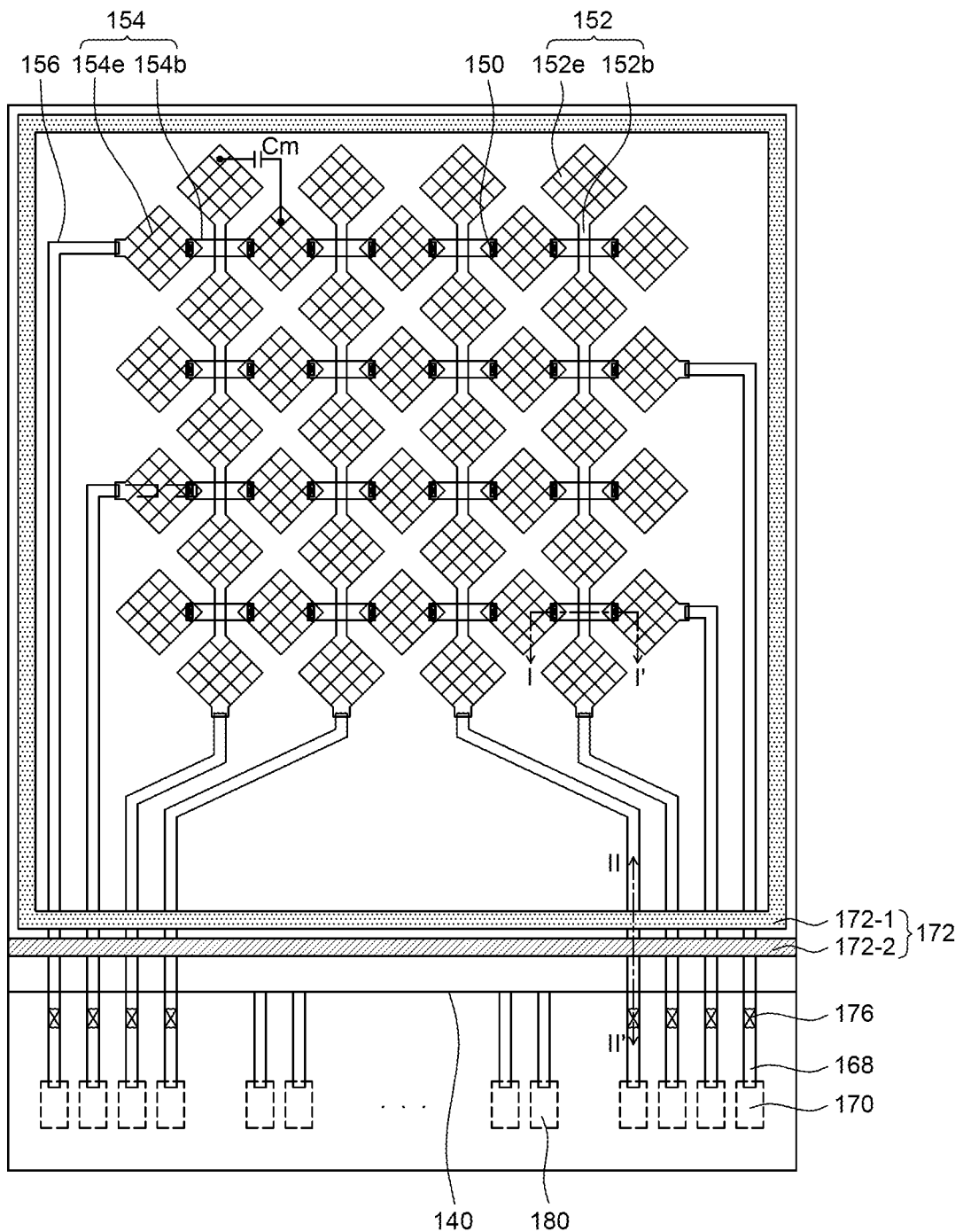
FIG. 3 is a plan view of the organic light emitting display device illustrated in FIG. 1.
Figure 4:
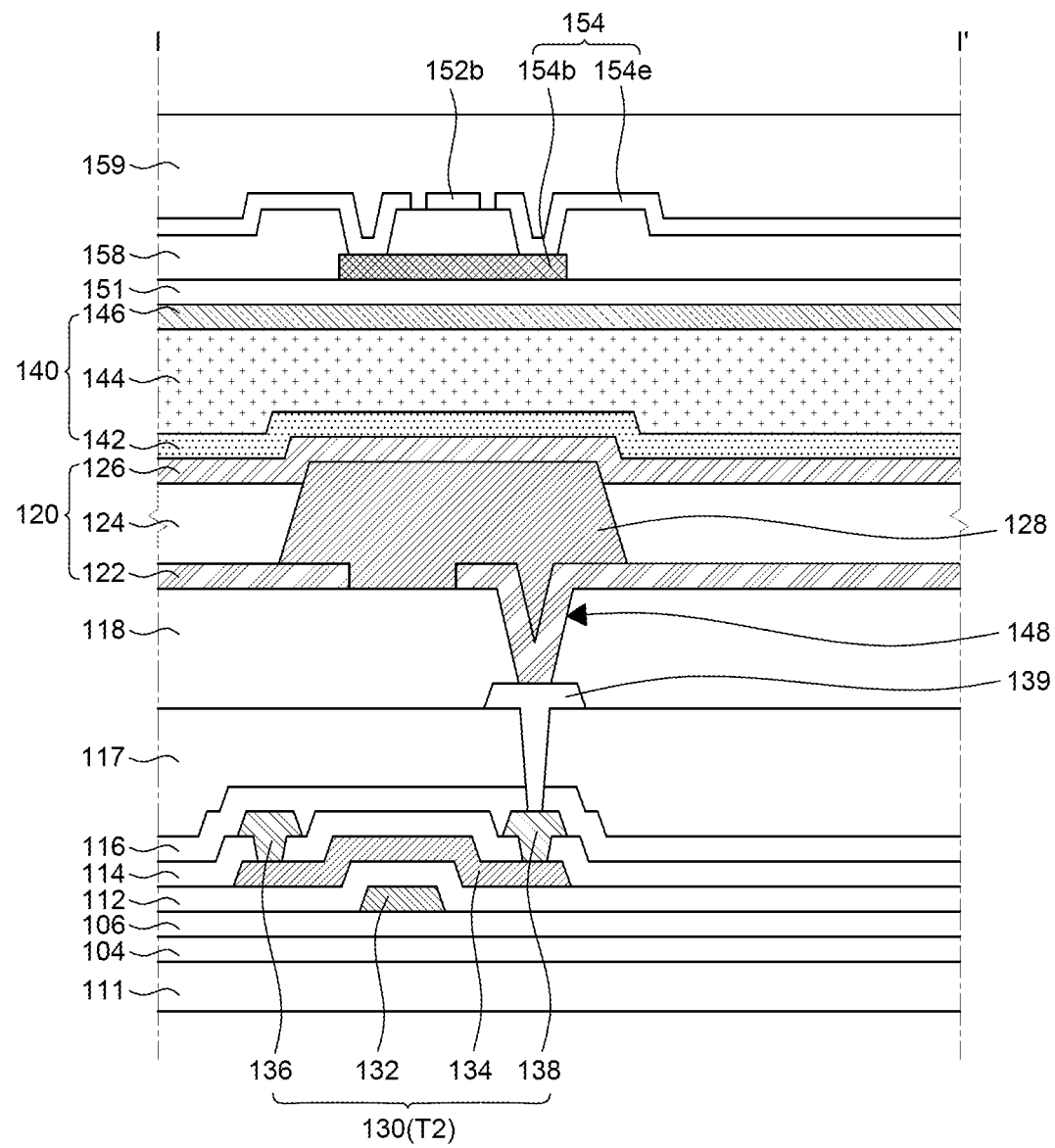
FIG. 4 is a cross-sectional view of the organic light emitting display device taken along line I-I' in FIG. 3.

FIG. 1 is an exploded perspective view of an organic light emitting display device in which a touch sensor is integrated. FIG. 2 is a circuit diagram of a sub-pixel illustrated in FIG. 1. FIG. 3 is a plan view of the organic light emitting display device illustrated in FIG. 1. FIG. 4 is a cross-sectional view of the organic light emitting display device taken along line I-I' in FIG. 3.

The organic light emitting display device having the touch sensor illustrated in FIG. 1 senses presence or absence of a touch and a touch position by detecting variances in mutual capacitance (Cm; touch sensor) by a user's touch through touch electrodes 152e and 154e illustrated in FIG. 2 during a touch period. In addition, the organic light emitting display device having the touch sensor illustrated in FIG. 1 displays an image through a unit pixel including a light emitting element 120. The unit pixel is composed of sub-pixels PXL of red (R), green (G) and blue (B), or composed of sub-pixels PXL of red (R), green (G), blue (B) and white (W).

To this end, the organic light emitting display device illustrated in FIG. 1 includes a plurality of the sub-pixels PXL disposed in a matrix form on a substrate 111, an encapsulation film 140 disposed on the plurality of sub-pixels PXL, and a mutual capacitance Cm disposed on the encapsulation film 140.

Each of the plurality of sub-pixels PXL includes a pixel driving circuit and a light emitting element 120 connected to the pixel driving circuit.

The pixel driving circuit includes a switching transistor T1, a driving transistor T2, and a storage capacitor Cst.

The switching transistor T1 is turned on when a scan pulse is supplied to a scan line SL and supplies a data signal supplied to a data line DL to the storage capacitor Cst and a gate electrode of the driving transistor T2.

The driving transistor T2 controls a current that is supplied from a high voltage (VDD) supply line to the light emitting element 120 in response to the data signal supplied to the gate electrode of the driving transistor T2 to thereby control the amount of light emitted from the light emitting element 120. In addition, even when the switching transistor T1 is turned off, the driving transistor T2 supplies a constant current until the data signal of a next frame is supplied by a voltage charged in the storage capacitor Cst so that light emission of the light emitting element 120 is maintained.

A circuit diagram of the sub-pixel will be described in more detail with reference to FIG. 2.

The display device according to the present disclosure includes the plurality of sub-pixels PXL in a display area. Each of the sub-pixels PXL displays a single color in the display device. For example, each sub-pixel PXL displays any one of red, green, blue, and white. In this case, the red, green, blue, and white sub-pixels PXL may form one pixel. The plurality of sub-pixels PXL may be disposed in a matrix on the substrate of the display device, and a plurality of lines may be disposed between the plurality of sub-pixels PXL in the display area.

In addition, various lines that are electrically connected to the lines disposed in the display area and apply signals to the light emitting elements 120 of the display device may be disposed in a pad area as well. Such lines may include, for example, a Vdd line, a Vdata line, a reference line (Vref line), a Vss line, and the like.

As illustrated in FIG. 2, each sub-pixel PXL of the display device according to the present disclosure includes a switching thin film transistor T1, a driving thin film transistor T2, a storage capacitor Cst, a sensing thin film transistor T3, an auxiliary thin film transistor T4, and a light emitting element 120. Since the sub-pixel PXL of the display device according to the present disclosure includes four thin film transistors and one capacitor, it may be referred to as a 4T1C structure. However, the structure of the sub-pixel PXL of the display device according to the present disclosure is not limited thereto, and the sub-pixel PXL may be formed in various compensation structures such as a 4T2C structure including four thin film transistors and two capacitors, a 5T2C structure including five thin film transistors and two capacitors, a 6T2C structure including six thin film transistors and two capacitors, and a 7T2C structure including seven thin film transistors and two capacitors.

Each of the four thin film transistors included in the sub-pixel PXL includes a semiconductor layer, a gate electrode, a source electrode, and a drain electrode, and may be a P-type thin film transistor or an N-type thin film transistor. FIG. 2 shows an N-type thin film transistor for convenience of explanation.

The switching thin film transistor T1 includes a drain electrode that is connected to the data line, a source electrode that is connected to a first node N1, and a gate electrode that is connected to a gate line. The switching thin film transistor T1 is turned on based on a gate voltage Vg that is applied from a gate driver to the gate line, and charges a data voltage Vdata that is applied from a data driver to the data line, in the first node N1.

The driving thin film transistor T2 includes a drain electrode that is connected to a high potential line (i.e., a Vdd line), a source electrode that is connected to an anode of a light emitting element 120, and a gate electrode connected to the first node N1. The driving thin film transistor T2 is turned on when a voltage of the first node N1 is higher than a threshold voltage Vth and turned off when the voltage of the first node N1 is lower than the threshold voltage and transfers a driving current received from the Vdd line to the light emitting element 120.

The storage capacitor Cst includes an electrode that is connected to the first node N1 and an electrode that is connected to the source electrode of the driving thin film transistor T2. The storage capacitor Cst maintains a potential difference between the gate electrode and the source electrode of the driving thin film transistor T2 during an emission time during which the light emitting element 120 emits light, so that a constant driving current is transmitted to the light emitting element 120.

The sensing thin film transistor T3 includes a drain electrode that is connected to the source electrode of the driving thin film transistor T2, a source electrode that is connected to a reference line, and a gate electrode that is connected to a sensing gate line. The sensing thin film transistor T3 is a thin film transistor for sensing the threshold voltage of the driving thin film transistor T2.

The auxiliary thin film transistor T4 includes a drain electrode that is electrically connected to a cathode of the light emitting element 120, a source electrode that is electrically connected to the reference line, and a gate electrode that is electrically connected to an auxiliary gate line. The auxiliary thin film transistor T4 is turned on in an emission period, and transmits a low potential voltage (i.e., Vref) to a cathode of the light emitting element 120.

FIG. 3 is a plan view of the organic light emitting display device having the touch sensor illustrated in FIG. 1.

Referring to FIG. 3, a plurality of sub-pixels including display pads 180, touch pads 170 and pixel driving circuits such as thin film transistors, scan lines and data lines overlapping each other are formed on the substrate 111 and then, the light emitting elements 120 connected to the pixel driving circuits are formed. Then, the encapsulation film 140 covering them is formed. In this case, regions of the touch pad 170 and the display pad 180 are exposed from the encapsulation film 140. The encapsulation film 140 blocks penetration of external moisture or oxygen into the light emitting element 120 that is vulnerable to external moisture or oxygen. To this end, the encapsulation film 140 may include a plurality of inorganic encapsulation layers and an organic encapsulation layer disposed between the plurality of inorganic encapsulation layers.

Meanwhile, in a non-display area of the substrate, a dam 172 that serves to prevent the organic encapsulation layer included in the encapsulation film 140 from overflowing to an outer portion may exist. For example, a primary dam 172-1 and a secondary dam 172-2 may be disposed. Here, the secondary dam 172-2 may be located more outside than the primary dam 172-1. Unlike the example, only the primary dam 172-1 may be located, and in some cases, an additional dam as well as the primary dam 172-1 and the secondary dam 172-2 may be further disposed.

Touch driving lines 152 and touch sensing lines 154 may be located on the encapsulation film 140. Each of the touch driving line 152 and the touch sensing line 154 is connected to a touch driving unit (not shown) through a routing line 156, a link line 168, and the touch pad 170 disposed in the non-display area. The touch driving unit may include touch driving circuitry, and may be referred to as the touch driving circuitry.

Accordingly, the routing line 156 and the link line 168 transmit a touch driving pulse that is generated in the touch driving unit to the touch driving line 152 through the touch pad 170, and transmit a touch signal from the touch sensing line 154 to the touch pad 170. The routing line 156 is connected to each of the touch driving line 152 and the touch sensing line 154 through a contact hole or directly connected thereto without a separate contact hole. Since the routing line 156 is formed by the same mask process as a first bridge 152b using the same material as the first bridge 152b, it is protected by a touch insulating layer 158.

The routing line 156 that is connected to a first touch electrode 152e may extend in a direction of the touch pad 170 from at least one of upper and lower sides of the display area as illustrated in FIG. 3. The routing line 156 that is connected to a second touch electrode 154e may extend in the direction of the touch pad 170 from at least one of left and right sides of the display area. Meanwhile, an arrangement of the routing line 156 is not limited to a structure of FIG. 3, and may be variously changed according to design matters of the display device.

The link line 168 that transmits a signal of the touch pad 170 may extend from the touch pad 170 toward the display area. The link line 168 and the routing line 156 may be located on different layers. The link line 168 and the routing line 156 may be electrically connected through a link line-routing line connection unit 176. The link line-routing line connection unit 176 may be located between the secondary dam 172-2 and the touch pad 170. The link line-routing line connection unit 176 may be or include a link line-routing line connection structure, and may be referred to as the link line-routing line connection structure 176.

FIG. 4 is a cross-sectional view of the light emitting display device taken along line I-I' in FIG. 3.

Referring to FIG. 4, the driving thin film transistor T2 and 130 include a gate electrode 132, a semiconductor layer 134 that overlaps the gate electrode 132 with a gate insulating layer 112 interposed therebetween, and source and drain electrodes 136 and 138 that are formed on an interlayer insulating layer 114 and contacting the semiconductor layer 134, as illustrated in FIG. 3. Here, the semiconductor layer 134 is formed on the gate insulating layer 112 with at least one of an amorphous semiconductor material, a polycrystalline semiconductor material, and an oxide semiconductor material. A multi-buffer layer 104 and an active buffer layer 106 are disposed between the gate electrode 132 and the substrate 111. The multi-buffer layer 104 delays diffusion of moisture and/or oxygen penetrating into the substrate 111. The active buffer layer 106 protects the semiconductor layer 134 and blocks various types of defects introduced from the substrate 111.

At this time, a top layer of the multi-buffer layer 104 that is in contact with the active buffer layer 106 is formed of a material having etching characteristics different from those of remaining layers of the multi-buffer layer 104, the active buffer layer 106, the gate insulating layer 112, and the interlayer insulating layer 114. The top layer of the multi-buffer layer 104 that is in contact with the active buffer layer 106 is formed of one of SiNx and SiOx, and the remaining layers of the multi-buffer layer 104, the active buffer layer 106, the gate insulating film 112, and the interlayer insulating film 114 are formed of the other of SiNx and SiOx. For example, the top layer of the multi-buffer layer 104 that is in contact with the active buffer layer 106 is formed of SiNx, and the remaining layers of the multi-buffer layer 104, the active buffer layer 106, the gate insulating film 112, and the interlayer insulating film 114 are formed of SiOx.

A pixel connection electrode 139 is disposed between first and second planarization layers 117 and 118. The pixel connection electrode 139 is exposed through a first pixel contact hole that penetrates a protective layer 116 and the first planarization layer 117, and is connected to the drain electrode 138. The pixel connection electrode 139 is formed of a material having a low resistivity, which is the same as or similar to that of the drain electrode 138.

The light emitting element 120 includes an anode electrode 122, at least one light emitting stack 124 formed on the anode electrode 122, and a cathode electrode 126 formed on the light emitting stack 124. The anode electrode 122 is electrically connected to the pixel connection electrode 139 that is exposed through a second pixel contact hole 119 penetrating the second planarization layer 118 disposed on the first planarization layer 117.

At least one light emitting stack 124 is formed on the anode electrode 122 of a light emitting area that is provided by a bank 128. At least one light emitting stack 124 is formed by stacking a hole-related layer, an organic light emitting layer, and an electron-related layer on the anode electrode 122 in the order, or in a reverse order. In addition, the light emitting stack 124 may include first and second light emitting stacks facing each other with a charge generation layer (CGL) interposed therebetween. In this case, the organic light emitting layer of any one of the first and second light emitting stacks generates blue light, and the organic light emitting layer of the other of the first and second light emitting stacks generates yellow-green light, so that white light is generated through the first and second light emitting stacks. Since white light generated by the light emitting stack 124 is incident on a color filter (not shown) located above or below the light emitting stack 124, a color image may be realized. In addition, a color image may be implemented by generating light of color corresponding to each sub-pixel in each light emitting stack 124 without a separate color filter. That is, the light emitting stack 124 of a red (R) sub-pixel may generate red light, the light emitting stack 124 of a green (G) sub-pixel may generate green light, and the light emitting stack 124 of a blue (B) sub-pixel may generate blue light.

The cathode electrode 126 is formed to face the anode electrode 122 with the light emitting stack 124 interposed therebetween and is connected to a low voltage (VSS) supply line.

The encapsulation film 140 blocks penetration of external moisture or oxygen into the light emitting element 120 that is vulnerable to external moisture or oxygen. To this end, the encapsulation film 140 includes a plurality of inorganic encapsulation layers 142 and 146 and an organic encapsulation layer 144 disposed between the plurality of inorganic encapsulation layers 142 and 146, and the inorganic encapsulation layer 146 is disposed on a top layer thereof. In this case, the encapsulation film 140 includes at least two inorganic encapsulation layers 142 and 146 and at least one organic encapsulation layer 144. In the present disclosure, a structure of the encapsulation film 140 in which the organic encapsulation layer 144 is disposed between first and second inorganic encapsulation layers 142 and 146 will be described as an example.

The first inorganic encapsulation layer 142 is formed on the substrate 111 on which the cathode electrode 126 is formed so as to be closest to the light emitting element 120. The first inorganic encapsulation layer 142 is formed of an inorganic insulating material capable of low-temperature deposition, such as silicon nitride (SiNx), silicon oxide (SiOx), silicon oxynitride (SiON), or aluminum oxide ($Al_2O_3$). Accordingly, since the first inorganic encapsulation layer 142 is deposited in a low-temperature atmosphere, it is possible to prevent damage to the light emitting stack 124 that is vulnerable to a high-temperature atmosphere during a deposition process of the first inorganic encapsulation layer 142.

The organic encapsulation layer 144 serves as a buffer to alleviate stress between respective layers due to bending of the organic light emitting display device, and enhances planarization performance. The organic encapsulation layer 144 is formed of an organic insulating material such as acrylic resin, epoxy resin, polyimide, polyethylene, or silicon oxycarbon (SiOC).

The second inorganic encapsulation layer 146 is formed to cover an upper surface and side surfaces of the organic encapsulation layer 144 and an upper surface of the first inorganic encapsulation layer 142 that is exposed by the organic encapsulation layer 144. Accordingly, the second inorganic encapsulation layer 146 reduces, minimizes or blocks penetration of external moisture or oxygen into the first inorganic encapsulation layer 142 and the organic encapsulation layer 144. The second inorganic encapsulation layer 146 is formed of an inorganic insulating material such as silicon nitride (SiNx), silicon oxide (SiOx), silicon oxynitride (SiON), or aluminum oxide ($Al_2O_3$). The first and second inorganic encapsulation layers 142 and 146 may be formed of the same material, and each thereof may be a plurality of layers.

The encapsulation film 140 having a total thickness of 10 µm to 30 µm may be beneficial to sufficiently prevent moisture penetration from the outside and prevent movement of internal particles and influence of the internal particles.

A touch buffer layer 151 may be disposed on the encapsulation film 140. The touch buffer layer 151 may be located between a plurality of the touch sensing lines 154 and a plurality of touch driving lines 152 and the cathode electrode 126 of the light emitting element 120.

The touch buffer layer 151 may be designed such that a separation distance between the touch sensing line 154 and the touch driving line 152 and the cathode electrode 126 of the light emitting element 120 maintains a predetermined minimum separation distance or selected separation distance (e.g., 1 µm). Accordingly, it is possible to reduce or prevent parasitic capacitance formed between the touch sensing line 154 and the touch driving line 152 and the cathode electrode 126 of the light emitting element 120, and through this, it is possible to prevent a decrease in touch sensitivity.

Without the touch buffer layer 151, the touch sensing line and the touch driving line may be disposed on the encapsulation film 140.

In addition, the touch buffer layer 151 may block penetration of a chemical solution (developer, etchant or the like) used in a manufacturing process of the touch sensing line and the touch driving line disposed on the touch buffer layer 151 or external moisture into the light emitting element 120 including an organic material. Accordingly, the touch buffer layer 151 may prevent damage to the light emitting stack 124 that is vulnerable to a chemical solution or moisture.

On the encapsulation film 140, the touch sensing line 154 and the touch driving line 152 are disposed to overlap with the touch insulating layer 158 interposed therebetween. The mutual capacitance Cm is formed at an area overlap of the touch sensing line 154 and the touch driving line 152. Accordingly, the mutual capacitance Cm serves as a touch sensor by charging of an electric charge by a touch driving pulse that is supplied to the touch driving line 152, and discharging of the charged electric charge.

The touch driving line 152 includes a plurality of first touch electrodes 152e and first bridges 152b (see FIG. 3) electrically connecting the plurality of first touch electrodes 152e.

The plurality of first touch electrodes 152e are spaced apart from each other at regular intervals along a Y-direction, which is a first direction, on the touch insulating layer 158. Each of the plurality of first touch electrodes 152e is electrically connected to the first touch electrode 152e adjacent thereto through the first bridge 152b.

The first bridge 152b is disposed on the touch insulating layer 158 that is on the same plane as the first touch electrode 152e and is electrically connected to the first touch electrode 152e without a separate contact hole.

The touch sensing line 154 includes a plurality of second touch electrodes 154e and second bridges 154b electrically connecting the plurality of second touch electrodes 154e.

The plurality of second touch electrodes 154e are spaced apart from each other at regular intervals along an X-direction, which is a second direction, on the touch insulating layer 158. Each of the plurality of second touch electrodes 154e is electrically connected to the second touch electrode 154e adjacent thereto through the second bridge 154b.

The second bridge 154b is formed on the second inorganic encapsulation layer 146 and is exposed through a touch contact hole 150 that penetrates the touch insulating layer 158 to thereby be electrically connected to the second touch electrode 154e. Since the second bridge 154b is disposed to overlap the bank 128 like the first bridge 152b, it is possible to prevent a reduction in opening ratio by the first and second bridges 152b and 154b.

Each of the first and second touch electrodes 152e and 154e and the first and second bridges 152b and 154b are formed in a single layer or multilayer structure using a conductive layer having good conductivity and high corrosion resistance and acid resistance, such as Al, Ti, Cu, or Mo. For example, each of the first and second touch electrodes 152e and 154e and the first and second bridges 152b and 154b are formed in a three-layered structure such as Ti/Al/Ti or Mo/Al/Mo.

Each of the first and second touch electrodes 152e and 154e and the first and second bridges 152b and 154b are formed in a mesh shape. Accordingly, resistance and capacitance of the first and second touch electrodes 152e and 154e and the first and second bridges 152b and 154b themselves are reduced, so that a reduction in RC time constant is resulted, thereby improving touch sensitivity. In addition, since line widths of the first and second touch electrodes 152e and 154e and the first and second bridges 152b and 154b in the mesh shape are very thin, it is possible to prevent decreases in the opening ratio and transmittance due to the first and second touch electrodes 152e and 154e and the first and second bridges 152b and 154b that are in the mesh shape.

A cover organic layer 159 may be formed to cover the touch sensing line 154 and the touch driving line 152 to prevent the touch sensing line 154 and the touch driving line 152 from being corroded by external moisture. For example, the cover organic layer 159 may be formed of an organic insulating material, a circularly polarizing plate, or a film of an epoxy or acrylic material. The cover organic layer 159 may not exist on the encapsulation film 140. That is, the cover organic layer 159 may be an optional component.

Figure 5:
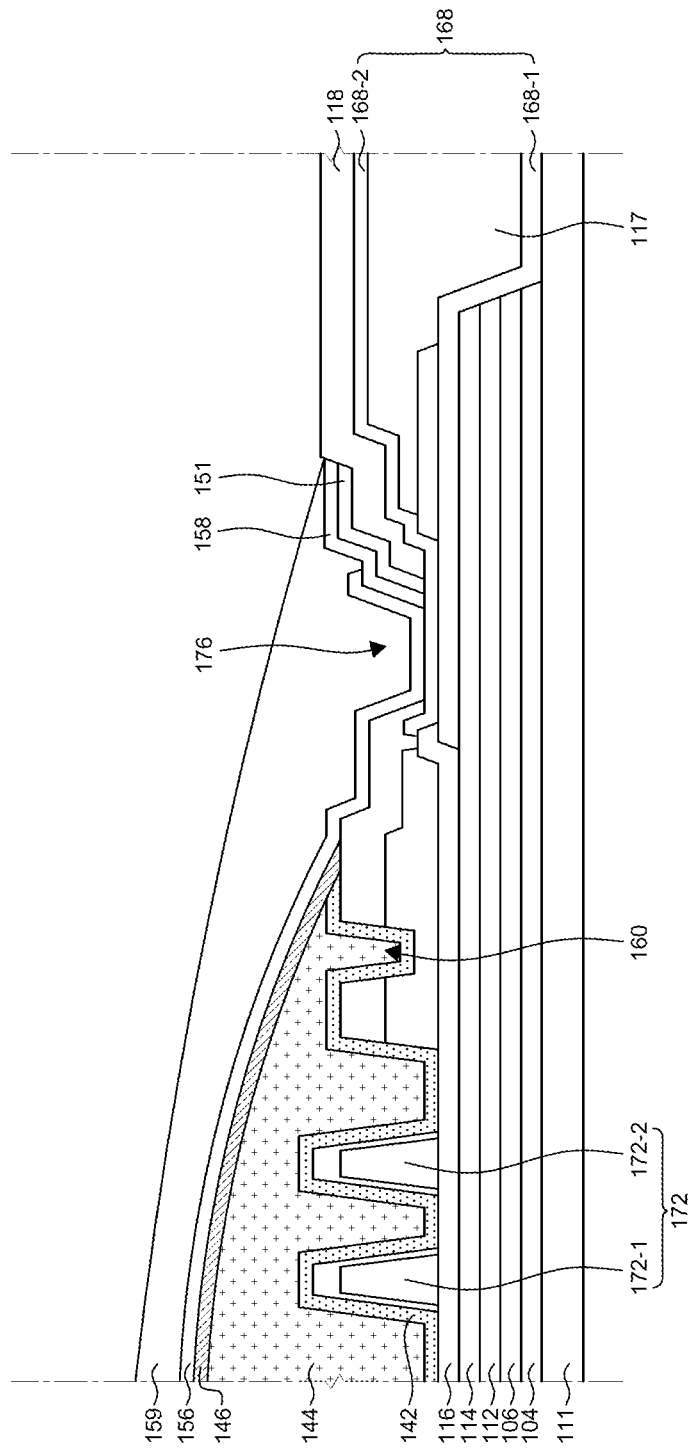
FIG. 5 is a partial cross-sectional view of a display device according to an exemplary embodiment of the present disclosure, illustrating an example of a cross-sectional structure of portion II-IF illustrated in FIG. 3.

FIG. 5 is a partial cross-sectional view of a display device according to an embodiment of the present disclosure, illustrating an example of a cross-sectional structure of portion II-IP illustrated in FIG. 3.

Referring to FIG. 5, a light emitting display device with an integrated touch screen may include the substrate 111 having a display area in which a plurality of display pixels are disposed and a non-display area surrounding the display area. The thin film transistor 130 and the light emitting element 120 may be disposed on the substrate 111. The light emitting display device may include the encapsulation film 140 that covers the display area and the non-display area and has the first inorganic encapsulation layer 142, the organic encapsulation layer 144, and the second inorganic encapsulation layer 146 stacked in an order. The encapsulation film 140 blocks penetration of external moisture or oxygen into the light emitting element 120 that is vulnerable to external moisture or oxygen.

The first inorganic encapsulation layer 142 is formed on the substrate 111 on which the cathode electrode 126 is formed so as to be closest to the light emitting element 120. The first inorganic encapsulation layer 142 is formed of an inorganic insulating material capable of low-temperature deposition, such as silicon nitride ($SiN_x$), silicon oxide ($SiO_x$), silicon oxynitride (SiON), or aluminum oxide ($Al_2O_3$). Accordingly, since the first inorganic encapsulation layer 142 is deposited in a low-temperature atmosphere, it is possible to prevent damage to the light emitting stack 124 that is vulnerable to a high-temperature atmosphere during a deposition process of the first inorganic encapsulation layer 142.

The organic encapsulation layer 144 serves as a buffer to alleviate stress between respective layers due to the bending of the organic light emitting display device, and enhances planarization performance. The organic encapsulation layer 144 is formed of an organic insulating material such as acrylic resin, epoxy resin, polyimide, polyethylene, or silicon oxycarbon (SiOC).

The second inorganic encapsulation layer 146 is formed to cover the upper surface and the side surfaces of the organic encapsulation layer 144 and the upper surface of the first inorganic encapsulation layer 142 that is exposed by the organic encapsulation layer 144. Accordingly, the second inorganic encapsulation layer 146 reduces, minimizes or blocks penetration of external moisture or oxygen into the first inorganic encapsulation layer 142 and the organic encapsulation layer 144. The second inorganic encapsulation layer 146 is formed of an inorganic insulating material such as silicon nitride ($SiN_x$), silicon oxide ($SiO_x$), silicon oxynitride (SiON), or aluminum oxide ($Al_2O_3$). The first and second inorganic encapsulation layers 142 and 146 may be formed of the same material, and each thereof may be a plurality of layers.

It is preferable that the encapsulation film 140 has a total thickness of 10 μm to 30 μm to sufficiently prevent moisture penetration from the outside and prevent movement of internal particles and influence of the internal particles.

The light emitting display device may include the plurality of first touch electrodes 152e disposed on the encapsulation film 140 and extending in the first direction and the plurality of second touch electrodes 154e extending in the second direction, as shown in FIG. 3.

The light emitting display device may include at least one inorganic insulating layer disposed on the substrate 111. For example, the multi-buffer layer 104 and the active buffer layer 106 are disposed between the thin film transistor 130 and the substrate 111. The multi-buffer layer 104 delays diffusion of moisture and/or oxygen penetrating into the substrate 111. The active buffer layer 106 protects the semiconductor layer 134 and blocks various types of defects introduced from the substrate 111.

In this case, the top layer of the multi-buffer layer 104 that is in contact with the active buffer layer 106 is formed of a material having etching characteristics different from those of the remaining layers of the multi-buffer layer 104. The top layer of the multi-buffer layer 104 that is in contact with the active buffer layer 106 may be formed of any one of SiNx and SiOx. The gate insulating layer 112 and the interlayer insulating layer 114 may be disposed on an upper portion of the active buffer layer 106. For example, the top layer of the multi-buffer layer 104 that is in contact with the active buffer layer 106 may be formed of SiNx, and the remaining layers of the multi-buffer layer 104, the active buffer layer 106, the gate insulating film 112, and the interlayer insulating film 114 may be formed of SiOx.

The first planarization layer 117 may be located on the inorganic insulating layer. The first planarization layer 117 may cover the thin film transistor 130 and planarize an upper portion of the thin film transistor 130. The second planarization layer 118 may be located on the first planarization layer 117. The second planarization layer 118 may be disposed to planarize an upper portion of the pixel connection electrode 139 connecting the drain electrode 138 of the thin film transistor 130 and the anode electrode 122 of the light emitting element 120.

The light emitting display device may include a hole pattern 160 that is located in the second planarization layer 118 and is filled with the organic encapsulation layer 144. The hole pattern 160 may penetrate the second planarization layer 118. The hole pattern 160 may be concavely formed in the first planarization layer 117 without penetrating the first planarization layer 117. The first inorganic encapsulation layer 142 may be located between the hole pattern 160 and the organic encapsulation layer 144. The hole pattern 160 being "filled with" may include many configurations. For example, the hole pattern 160 may have the organic encapsulation layer 144 therein and may also have materials, layers, or other layers than the organic encapsulation layer 144 therein that result in the hole being full. It can also include the stated material being the last material provided to complete the filling of the hole. On the other hand, the terms "completely filled with" or "exclusively filled with" carry meaning that there is nothing else used to the fill the hole except the material stated.

In the non-display area of the substrate 111, the dam 172 that serves to prevent the organic encapsulation layer included in the encapsulation film 140 from overflowing to the outer portion may exist. For example, the primary dam 172-1 and the secondary dam 172-2 may be disposed. Here, the secondary dam 172-2 may be located more outside than the primary dam 172-1. Unlike the example, only the primary dam 172-1 may be located, and in some cases, an additional dam as well as the primary dam 172-1 and the secondary dam 172-2 may be further disposed. The primary dam 172-1 and the secondary dam 172-2 may be located closer to the display area than the hole pattern 160.

The light emitting display device may include the touch pads 170 (refer to FIG. 3) that are in the non-display area and transmit signals to the first touch electrode 152e and the second touch electrode 154e. The light emitting display device may further include the link line 168 that is electrically connected to the touch pad 170. The link line may include a first link line 168-1 and a second link line 168-2. The first link line 168-1 may be formed of the same material as the drain electrode 138 of the thin film transistor 130. Since the second link line 168-2 is formed by the same mask process as the pixel connection electrode 139 in the display area, it may be formed of the same material on the same plane as the pixel connection electrode 139 in the display area.

The light emitting display device may include the routing lines 156 that are directly connected to the first touch electrode 152-e and the second touch electrode 154-e, respectively, and disposed in the non-display area. The routing line 156 may be formed by the same mask process as the first bridge 152-b in the display area. That is, the routing line 156 may be formed of the same material on the same plane as the first bridge 152-b in the display area. The routing line 156 connected to the first touch electrode 152-e may extend in the direction of the touch pad 170 from at least one of the upper and lower sides of the display area as illustrated in FIG. 3. The routing line 156 connected to the second touch electrode 154-e may extend in the direction of the touch pad 170 from at least one of the left and right sides of the display area. Meanwhile, the arrangement of the routing lines 156 is not limited to the above-described structure, and may be various changed according to design matters of the display device.

The light emitting display device may include the link line-routing line connection unit 176 which is located on the outside of the hole pattern 160 and in which the link lines 168 and 169 and the routing line 156 are in contact. The link line 168 and the routing line 156 that are in different layers may be electrically and physically connected to each other through the link line-routing line connection unit 176.

In this manner, the hole pattern 160 that penetrates the second planarization layer 118 and is formed concavely from an upper surface of the first planarization layer 117 is provided where the first and second planarization layers 117 and 118 formed on the outside of the dam 172 are sequentially stacked, the organic encapsulation layer 144 of the encapsulation film 140 overflowing to the outside of the dam 172 fills the hole pattern 160. For this reason, the organic encapsulation layer 144 is not applied to the link line-routing line connection unit 176 where the routing line 156 and the link line 168 are connected. Therefore, it is possible to prevent a phenomenon in which a connection defect of the routing line 156 formed on the encapsulation film 144 and the link line 168 connected to the touch pad 170 occurs. That is, the touch driving pulse generated in the touch driving unit is stably transmitted to the touch driving line 152 through the touch pad 170, and the touch signal from the touch sensing line 154 is stably transmitted to the touch pad 170, so that a light emitting display device with an integrated touch screen that has high reliability can be provided.

A method of manufacturing a light emitting display device with an integrated touch screen according to the embodiment of the present disclosure includes the steps of: forming a substrate 111 including a display area in which a plurality of display pixels are disposed and a non-display area surrounding the display area; forming an encapsulation film 140 covering the display area and the non-display area, the encapsulation film 140 having a first inorganic encapsulation layer 142, an organic encapsulation layer 144, and a second inorganic encapsulation layer 146 stacked in an order; disposing a first touch electrode 152e extending in a first direction and a second touch electrode 154e extending in a second direction on the encapsulation film 140; disposing at least one inorganic insulating layer, for example, a multi-buffer layer 104 and an active buffer layer 106, on the substrate 111; disposing a first planarization layer 117 on the inorganic insulating layer; disposing a second planarization layer 118 on the first planarization layer 117; and forming a hole pattern 160 in the second planarization layer 118, wherein the hole pattern 160 is filled with the organic encapsulation layer 144.

Preferably, the hole pattern 160 penetrates the second planarization layer 118; the hole pattern 160 is concavely formed in the first planarization layer 117; and the first inorganic encapsulation layer 142 is located between the hole pattern 160 and the organic encapsulation layer 144.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device with an integrated touch screen, the light emitting device comprising:
    a substrate including:
        a display area in which a plurality of display pixels are disposed; and
        a non-display area surrounding the display area;
    an encapsulation film covering the display area and the non-display area and having:
        a first inorganic encapsulation layer,
        an organic encapsulation layer, and
        a second inorganic encapsulation layer,
        the first inorganic encapsulation layer, the organic encapsulation layer and the second inorganic encapsulation layer being stacked in an order;
    first touch electrodes disposed on the encapsulation film and extending in a first direction;
    second touch electrodes extending in a second direction;
    a plurality of touch pads disposed in the non-display area, each of the first touch electrodes and the second touch electrodes receiving a signal from one of the touch pads of the plurality of touch pads;
    at least one inorganic insulating layer disposed on the substrate;
    a first planarization layer disposed on the inorganic insulating layer;
    a second planarization layer disposed on the first planarization layer;
    a cover organic layer disposed on the encapsulation film in the dis play area and in the non-display area;
    at least one dam disposed in the non-display area; and
    a hole pattern formed in the second planarization layer, the hole pattern being in the non-display area, the at least one dam being between the hole pattern and the display area;
    a link line-routing line connection unit positioned between the touch pads and the hole pattern, the link line-routing line connection unit providing contact between a link line and a routing line;
    wherein the organic encapsulation layer extends continuously over the at least one dam and the hole pattern, the hole pattern having the organic encapsulation layer therein, and
    wherein the cover organic layer extends continuously over the at least one dam, the hole pattern and the link line-routing line connection unit.

2. The light emitting display device with an integrated touch screen of claim 1:
    wherein the link line is one of a plurality of link lines electrically connected to the touch pads.

3. The light emitting display device with an integrated touch screen of claim 2:
    wherein the routing line is one of a plurality of routing lines in the non-display area, each of the first touch electrodes and the second touch electrodes being directly connected to one of the plurality of routing lines.

4. The light emitting display device with an integrated touch screen of claim 3, wherein the hole pattern is located between the at least one dam and the link line-routing line connection unit.

5. The light emitting display device with an integrated touch screen of claim 4, further comprising:
    a light emitting element in the display area; and
    a thin film transistor electrically connected to the light emitting element.

6. The light emitting display device with an integrated touch screen of claim 5, wherein the first planarization layer covers the thin film transistor.

7. The light emitting display device with an integrated touch screen of claim 6, wherein the plurality of link lines includes a first link line and a second link line.

8. The light emitting display device with an integrated touch screen of claim 7, wherein the first link line is formed of a same material as a drain electrode of the thin film transistor.

9. The light emitting display device with an integrated touch screen of claim 8, wherein the second link line is formed of a same material as a pixel connection electrode connecting the thin film transistor and the light emitting element.

10. The light emitting display device with an integrated touch screen of claim 1, wherein the hole pattern penetrates the second planarization layer.

11. The light emitting display device with an integrated touch screen of claim 10, wherein the hole pattern is concavely formed in the first planarization layer.

12. The light emitting display device with an integrated touch screen of claim 11, wherein the first inorganic encapsulation layer is located between the hole pattern and the organic encapsulation layer.

13. The light emitting display device with an integrated touch screen of claim 1, further comprising a bank disposed between the second planarization layer and the encapsulation film in the display area.

14. The light emitting display device with an integrated touch screen of claim 1, wherein the cover organic layer terminates prior to the touch pads and does not extend over the touch pads.

15. A method of manufacturing a light emitting display device with an integrated touch screen, the method comprising:

forming a substrate including a display area in which a plurality of display pixels are disposed and a non-display area surrounding the display area;
  disposing touch pads in the non-display area;
  forming an encapsulation film covering the display area and the non-display area, the encapsulation film having a first inorganic encapsulation layer, an organic encapsulation layer, and a second inorganic encapsulation layer stacked in an order;
  disposing first touch electrodes extending in a first direction and second touch electrodes extending in a second direction, the first and second touch electrodes being formed on the encapsulation film;
  disposing at least one inorganic insulating layer on the substrate;
  disposing a first planarization layer on the inorganic insulating layer;
  disposing a second planarization layer on the first planarization layer;
  forming at least one dam in the non-display area; and
  forming a hole pattern in the second planarization layer, the hole pattern being in the non-display area, the at least one dam being between the hole pattern and the display area;
  forming a link line-routing line connection unit positioned between the touch pads and the hole pattern, the link line-routing line connection unit providing contact between a link line and a routing line;
  forming a cover organic layer disposed on the encapsulation film in the display area and in the non-display area;
  wherein each of the first and second touch electrodes receives a signal from one of the touch pads,
  wherein the organic encapsulation layer extends continuously over the at least one dam and the hole pattern, the hole pattern having the organic encapsulation layer therein, and
  wherein the cover organic layer extends continuously over the at least one dam, the hole pattern and the link line-routing line connection unit.

16. The method of claim 15, wherein the hole pattern penetrates the second planarization layer.

17. The method of claim 16, wherein the hole pattern is concavely formed in the first planarization layer.

18. The method of claim 17, wherein the first inorganic encapsulation layer is located between the hole pattern and the organic encapsulation layer.

* * * * *

UNITED STATES PATENT AND TRADEMARK OFFICE
CERTIFICATE OF CORRECTION

| | | |
|---|---|---|
| PATENT NO. | : 11,972,069 B2 | Page 1 of 1 |
| APPLICATION NO. | : 17/518529 | |
| DATED | : April 30, 2024 | |
| INVENTOR(S) | : Geon Jang et al. | |

It is certified that error appears in the above-identified patent and that said Letters Patent is hereby corrected as shown below:

In the Claims

<u>Column 14, Claim 1, Line 6:</u>
"the dis play area"
Should read:
--the display area--.

Signed and Sealed this
Thirtieth Day of July, 2024

Katherine Kelly Vidal
*Director of the United States Patent and Trademark Office*